United States Patent
Shimizu

(10) Patent No.: US 7,224,018 B2
(45) Date of Patent: May 29, 2007

(54) SEMICONDUCTOR MEMORY DEVICE WITH BIT LINE OF SMALL RESISTANCE AND MANUFACTURING METHOD THEREOF

(75) Inventor: Satoshi Shimizu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/896,060

(22) Filed: Jul. 22, 2004

(65) Prior Publication Data
US 2004/0262674 A1    Dec. 30, 2004

(30) Foreign Application Priority Data
Aug. 6, 2003    (JP) .............................. 2003-287831

(51) Int. Cl.
*H01L 29/76* (2006.01)
(52) U.S. Cl. ...................................... 257/314; 438/257
(58) Field of Classification Search ........ 257/314–317, 257/382–384, E27.085, E21.209, E21.613; 438/257
See application file for complete search history.

(56) References Cited

U.S. PATENT DOCUMENTS

| | | | |
|---|---|---|---|
| 5,168,334 A | | 12/1992 | Mitchell et al. |
| 5,362,662 A | | 11/1994 | Ando et al. |
| 5,717,635 A | * | 2/1998 | Akatsu .................. 365/185.05 |
| 6,174,758 B1 | | 1/2001 | Nachumovsky |
| 6,218,695 B1 | | 4/2001 | Nachumovsky |
| 6,512,263 B1 | * | 1/2003 | Yuan et al. .................. 257/316 |

FOREIGN PATENT DOCUMENTS

KR    1998-053139    9/1998

OTHER PUBLICATIONS

Eitan, Boaz., et al. "Can NROM, a 2-bit, Trapping Storage NVM Cell, Give a Real Challenge to Floating Gate Cells?", Presented at the International Conference on Solid State devices and Materials. 1999, Tokyo, pp. 3.
Office Action dated May 26, 2006.

* cited by examiner

*Primary Examiner*—David Vu
(74) *Attorney, Agent, or Firm*—McDermott Will & Emery LLP

(57) ABSTRACT

A reduction of a resistance of a bit line of a memory cell array and a reduction of a forming area of the memory cell array are planed.

Respective bit lines running at right angles to a word line are composed of a diffusion bit line formed in a semiconductor substrate and a linear metal bit line on an upper side of the diffusion bit line. The diffusion bit line is formed in a linear pattern on a lower side of the metal bit line in the same manner, and the metal bit line is connected with the diffusion bit line between the word lines. An interlayer insulating film is formed on the memory cell array, and the metal bit line is formed with being buried in it.

5 Claims, 20 Drawing Sheets

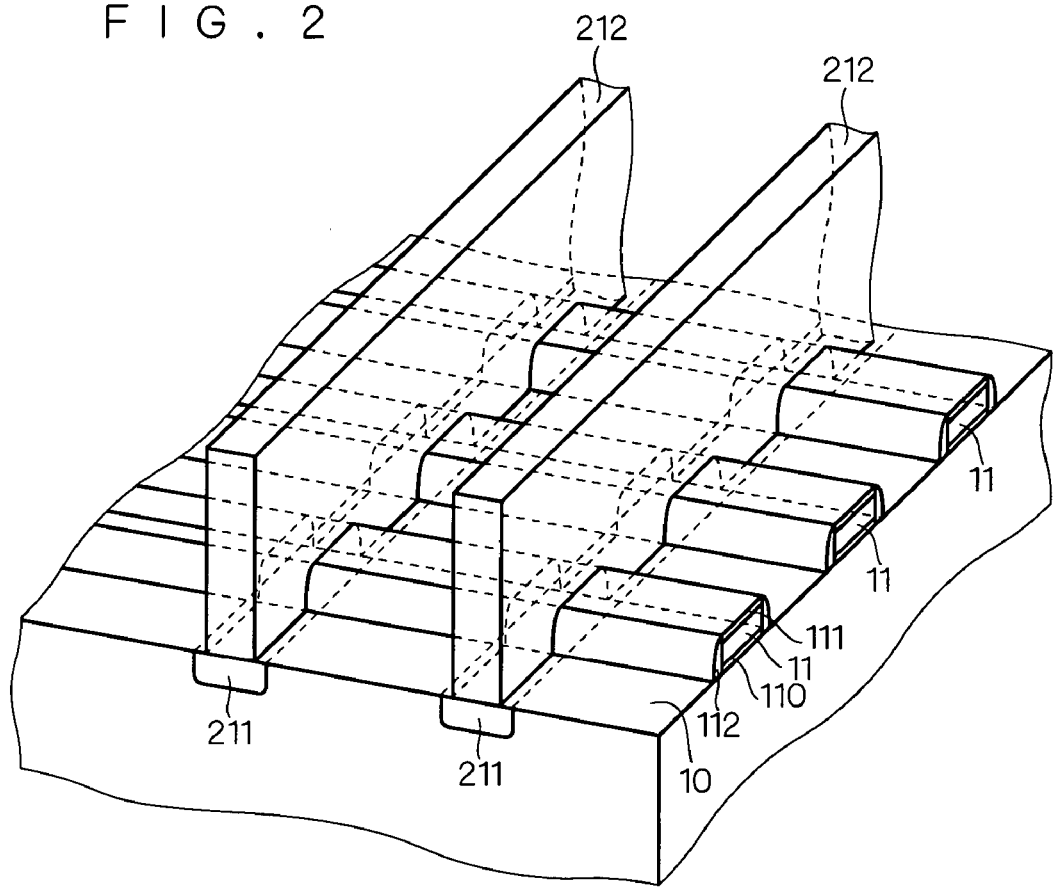
F I G . 2

SEMICONDUCTOR MEMORY DEVICE WITH BIT LINE OF SMALL RESISTANCE AND MANUFACTURING METHOD THEREOF

BACKGROUND OF THE INVENTION

1. Field of the Invention

The present invention relates to a semiconductor memory device and its manufacturing method.

2. Description of the Background Art

A MONOS (Metal Oxide Nitride Oxide Semiconductor) transistor is mentioned as one of transistors (memory transistors) employed for memory cells of non-volatile memories ("Can NROM, a 2-bit, Trapping Storage NVM Cell, Give a Real Challenge to Floating Gate Cells?", by Boaz Eitan et al., Technical paper presented at the International Conference on Solid State Devices and Materials (Tokyo, 1999), SSDM 1999, for example). This MONOS transistor has a source region and a drain region formed in a semiconductor substrate, a gate insulating film formed on the semiconductor substrate and a gate electrode formed on that gate insulating film. The gate insulating film of the MONOS transistor is a laminated film (ONO (Oxide Nitride Oxide) film) that a silicon nitride film is sandwiched between silicon oxide films.

The MONOS transistor retains memories by accumulating an electric charge in a trap in the silicon nitride film of the ONO film. Moreover, there is a so-called multi-bit MONOS transistor which can retain two bits of the memories in one cell by accumulating the electric charge partly in two parts in different places from each other in one MONOS transistor (called as a NROM). Accordingly, with regard to the MONOS transistor, it is possible to make a cell area per one bit be sharply smaller as compared with conventional floating gate type memory transistors and so on. Moreover, it also has a feature that it is easy to form by reason of simplicity of its structure and also has a feature that there is little leakage of the electric charge by reason that the electric charge is accumulated in the insulating film (the silicon nitride film), thus it has a high reliability.

In the meantime, a "fieldless array" is known as a structure of memory cell arrays of the non-volatile memories (U.S. Pat. No. 6,174,758, for example). This fieldless array is defined as an array that a field oxide film is not employed to isolate respective elements constituting the array. With regard to the fieldless memory cell array, the filed oxide film is not necessary between the memory transistors, thus the memory transistors can be placed in the semiconductor substrate at high density, and a reduction of a forming area of the memory cell array can be planned.

As described in U.S. Pat. No. 6,174,758, a bit line is a diffusion wiring (a diffusion bit line) formed in the semiconductor substrate in the conventional fieldless memory cell array. The diffusion wiring has a high resistance as compared with a metal wiring, thus the resistance of the bit wiring becomes large, especially when the memory cell array becomes large in scale in the memory cell array having the diffusion bit line. Accordingly, contacts connected with wirings in an upper layer are formed at intervals of several to several tens bits of the cells on the diffusion bit line to cover an influence of the high resistance of the diffusion bit line and to plan a reduction of the resistance of the bit line, conventionally. That is to say, it is necessary for the memory cell having the conventional fieldless array structure to secure a region to form the contact on the diffusion bit line. This prevents the reduction of the forming area of the memory cell array.

SUMMARY OF THE INVENTION

The present invention is performed to solve such a problem as described above, and it is an object to provide a semiconductor memory device and its manufacturing method planning a reduction of the resistance of a bit line of a memory cell array and also contributing to a reduction of a forming area of the memory cell array.

The semiconductor memory device according to the present invention has plural linear word lines formed on a semiconductor substrate, plural linear bit lines running at right angles to the word lines and a memory transistor formed between the bit lines in the semiconductor substrate and employing the word lines as a gate electrode. An interlayer insulating film is formed on the memory transistor. Each of the bit lines is composed of a diffusion bit line formed in the semiconductor substrate and a metal bit line formed with being buried in the interlayer insulating film in a linear pattern and connected with the diffusion bit line between the word lines.

The respective bit lines constituting the memory cell array are composed of the diffusion bit line and the metal bit line, thus a resistance of the bit lines becomes smaller than that of a conventional memory cell array. Accordingly, it is not necessary to form a contact for a purpose of reducing the resistance of the bit lines, and is possible to contribute to the reduction the forming area of the memory cell array.

Moreover, a first aspect of a manufacturing method of a semiconductor memory device according to the present invention includes steps of (a) to (e) described below. The step (a) is a step of forming plural linear word lines having a gate insulating film in its lower surface, a first insulating film in its upper surface and a second insulating film in its side surface on a semiconductor substrate. The step (b) is a step of forming an interlayer insulating film on the word lines. The step (c) is a step of forming a linear trench running at right angles to the word lines in the interlayer insulating film and exposing the semiconductor substrate between the word lines in the trench. The step (d) is a step of forming a diffusion bit line in the semiconductor substrate by performing an ion implantation in the trench. The step (e) is a step of forming a linear metal bit line in the trench by filling up the trench with a predetermined metal.

The respective bit lines constituting the memory cell array are composed of the diffusion bit line and the metal bit line, thus a resistance of the bit lines becomes smaller than that of a conventional memory cell array. Accordingly, it is not necessary to form a contact for a purpose of reducing the resistance of the bit lines, and is possible to contribute to the reduction of the forming area of the memory cell array.

Moreover, a second aspect includes steps (a) to (h) described below. The step (a) is a step of forming a gate insulating film on a semiconductor substrate and forming a resist having plural linear opening parts on the gate insulating film. The step (b) is a step of removing the gate insulating film in a linear pattern by an etching employing the resist as a mask. The step (c) is a step of forming a linear diffusion bit line in a semiconductor substrate by an ion implantation employing the resist as a mask. The step (d) is a step of forming a linear third insulating film on an upper part of the diffusion bit line. The step (e) is a step of forming plural linear word lines running at right angles to the diffusion bit line and having a first insulating film in its upper surface and a second insulating film in its side surface on the gate insulating film and the third insulating film. The step (f) is a step of forming an interlayer insulating film on the word lines. The step (g) is a step of forming a linear trench on an upper side of the diffusion bit line in the interlayer insulating film, removing the third insulating film between the word lines in the trench and exposing the diffusion bit line. The step (h) is a step of forming a linear metal bit line in the trench by filling up the trench with a predetermined metal.

An ion implantation to form the diffusion bit line is performed before forming the word lines, thus the word lines do not become a mask when that ion implantation is performed. Accordingly, the diffusion bit line whose concentration of an impurity is uniform is formed in a longitudinal direction of the diffusion bit line. Moreover, an impurity ion of the diffusion bit line is thermally diffused by a heat treatment in a forming process of the insulating film on diffusion bit line performed after forming the diffusion bit line, thus a profile of the concentration of the impurity in the diffusion bit line becomes smooth. Accordingly, the memory cell can perform stably and reliability in the performance is improved.

Furthermore, a third aspect includes steps (a) to (h) described below. The step (a) is a step of forming a gate insulating film on a semiconductor substrate and forming a resist having plural linear opening parts on the gate insulating film. The step (b) is a step of removing the gate insulating film in a linear pattern by an etching employing the resist as a mask. The step (c) is a step of forming a linear third insulating film in a region on an upper part of the semiconductor substrate that the gate insulating film is removed in the step (b). The step (d) is a step of forming plural linear word lines running at right angles to the third insulating film and having a first insulating film in its upper surface and a second insulating film in its side surface on the gate insulating film and the third insulating film. The step (e) is a step of forming an interlayer insulating film on the word lines. The step (f) is a step of forming a linear trench whose width is narrower than that of an insulating film on diffusion bit line on an upper side of the third insulating film in the interlayer insulating film. The step (g) is a step of forming a diffusion bit line in the semiconductor substrate by performing an ion implantation in the trench. The step (h) is a step of forming a linear metal bit line in the trench by filling up the trench with a predetermined metal.

The diffusion bit line is not stuck out from the insulating film on diffusion bit line, thus an electric field concentration in an edge part of a source/drain of the memory transistor is weakened. According to that, the memory cell can perform stably and the reliability in the performance is improved.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 and 2 are drawings illustrating compositions of a semiconductor memory device according to a preferred embodiment 1.

DESCRIPTION OF THE PREFERRED EMBODIMENTS

<Preferred Embodiment 1>

Figure 1:
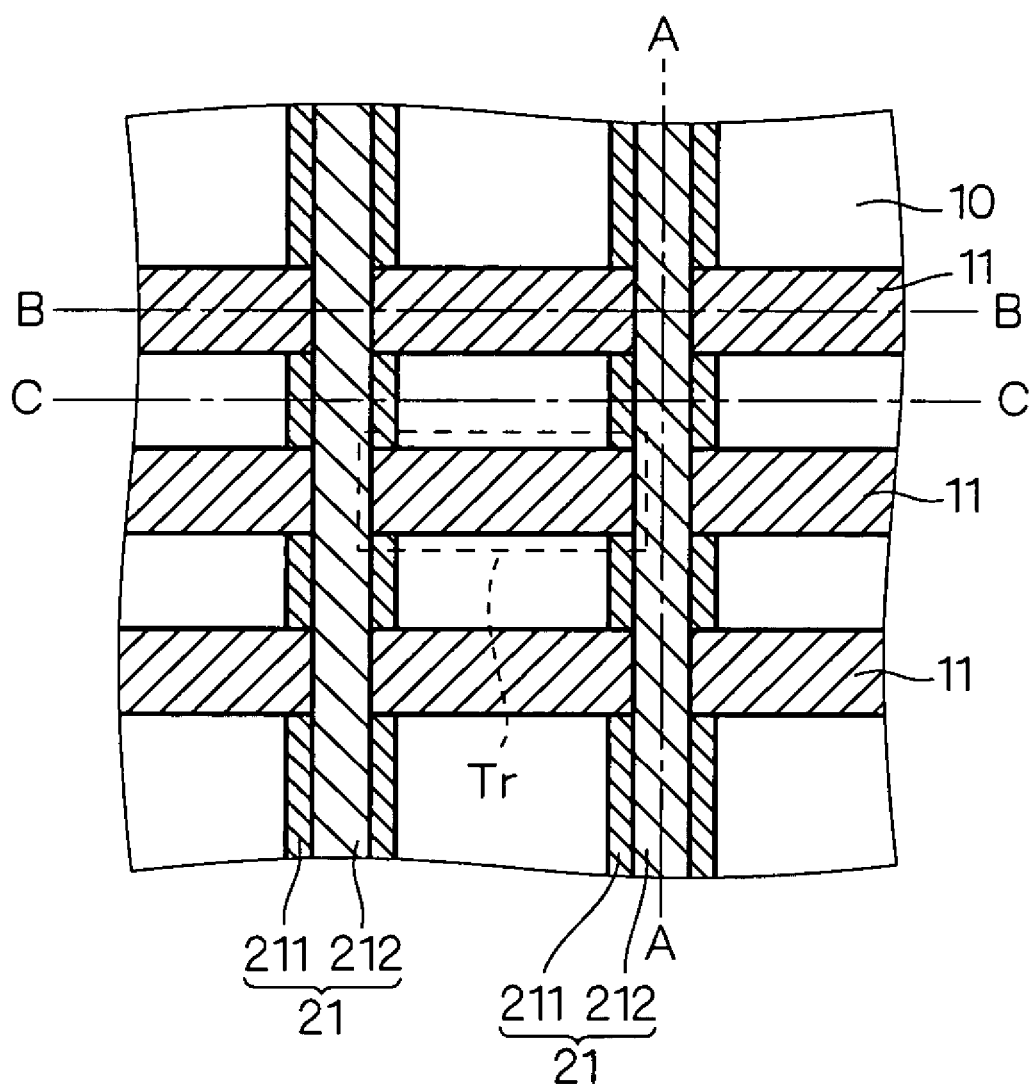

FIGS. 1 and 2 are drawings for describing a composition of a semiconductor memory device according to the preferred embodiment 1 of the present invention, and are a top view and a perspective view typically expressing a memory cell array of that semiconductor memory device, respectively. The memory cell array of that semiconductor memory device has plural linear word lines 11 formed on a semiconductor substrate 10 and a plural linear bit lines 21 running at right angles to the word lines 11 as shown in these drawings. A memory transistor employing the word lines 11 as a gate electrode is formed with extending over the two bit lines 21 in a region between the respective bit lines 21 of the semiconductor substrate 10 (a region Tr in FIG. 1, for example).

As shown in FIG. 2, the word line 11 has a gate insulating film 110 of the memory transistor on its lower surface, a hard mask 111 which is a first insulating film on its upper surface and a sidewall 112 which is a second insulating film on its side surface (these are omitted in FIG. 1 for convenience). The one word line 11 is connected with plural gates of the memory transistors. That is to say, the respective word lines 11 function as plural gate electrodes of the memory transistors.

For example, in case that the memory transistor is a conventional floating gate type memory transistor, the gate insulating film 110 has a trilaminar structure that a floating gate layer such as polysilicon and so on is sandwiched between silicon oxide film layers. Moreover, in case that the memory transistor is the MONOS transistor described above, it is an ONO film having trilaminar structure that a silicon nitride film layer is sandwiched between the silicon oxide film layers. The memory transistor is described as the MONOS transistor in the present preferred embodiment hereinafter.

The respective bit lines 21 are composed of a diffusion bit line 211 formed in the semiconductor substrate 10 and a linear metal bit line 212 on an upper side of the diffusion bit line 211. The diffusion bit line 211 is formed in a linear pattern on a lower side of the metal bit line 212 in the same manner, and the metal bit line 212 is connected with the diffusion bit line 211 between the word lines 11. Moreover, the metal bit line 212 and the word line 11 are isolated from each other by the hard mask 111 and the sidewall 112. Besides, although omitted in FIG. 1 and FIG. 2, an interlayer insulating film is formed on the memory cell array, and the metal bit line 212 is formed by being buried in it in a linear pattern.

The diffusion bit line 211 functions as a source/drain of the respective transistors, too. For example, with regard to the memory transistor formed in the region Tr in FIG. 1, the two diffusion bit lines 211 on both edges of the region Tr become the source/drain, respectively, and a region under the word line 11 between the two diffusion bit lines 211 becomes a channel region. The one diffusion bit line 211 connects plural sources/drains of the memory transistors. That is to say, the diffusion bit lines 211 function as the plural sources/drains of the memory transistors, respectively.

As known from FIG. 1 and FIG. 2, this memory cell array is a so-called a fieldless array that a field oxide film to isolate the respective memory transistors from each other does not exist. As described above, with regard to the conventional fieldless memory cell array, the bit line is composed of only a diffusion wiring (diffusion bit line) formed in the semiconductor substrate, thus there is a problem that the bit line has a high resistance. However, in the present invention, the linear bit lines 21 are composed of the diffusion bit line 211 and the metal bit line 212, respectively, thus the resistance of the bit line becomes smaller than that of the conventional memory cell array. Accordingly, it is not necessary to form a contact for a purpose of reducing the resistance of the bit line, and is possible to contribute to a reduction of the forming area of the memory cell array.

Figure 6:
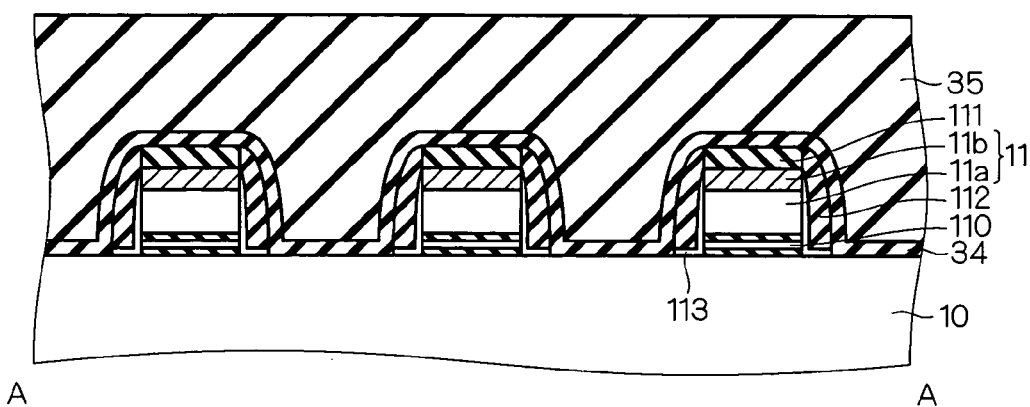
Figure 7:
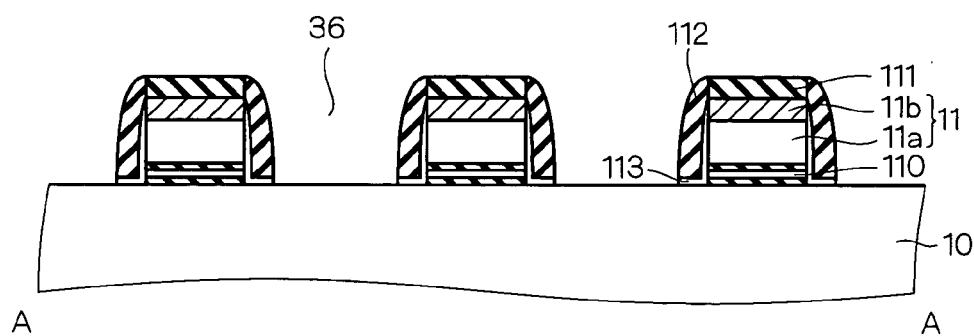
Figure 8:
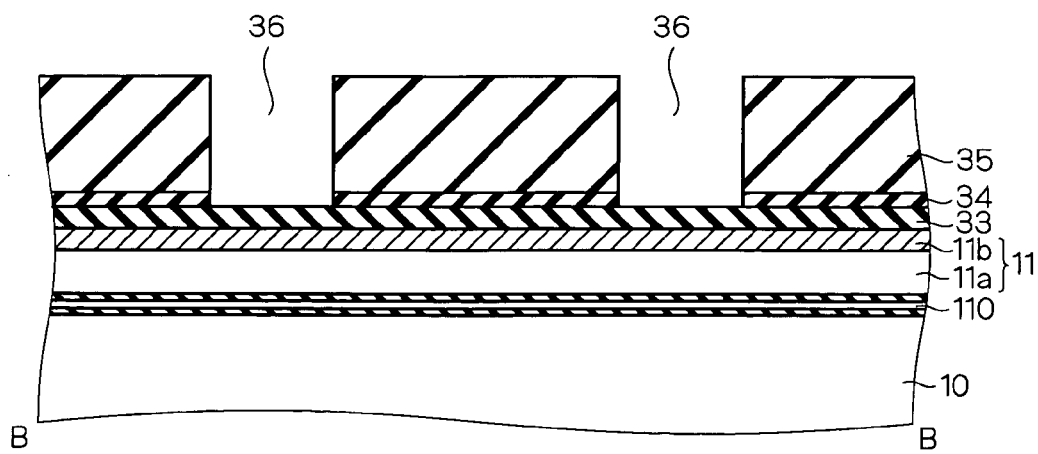
Figure 9:
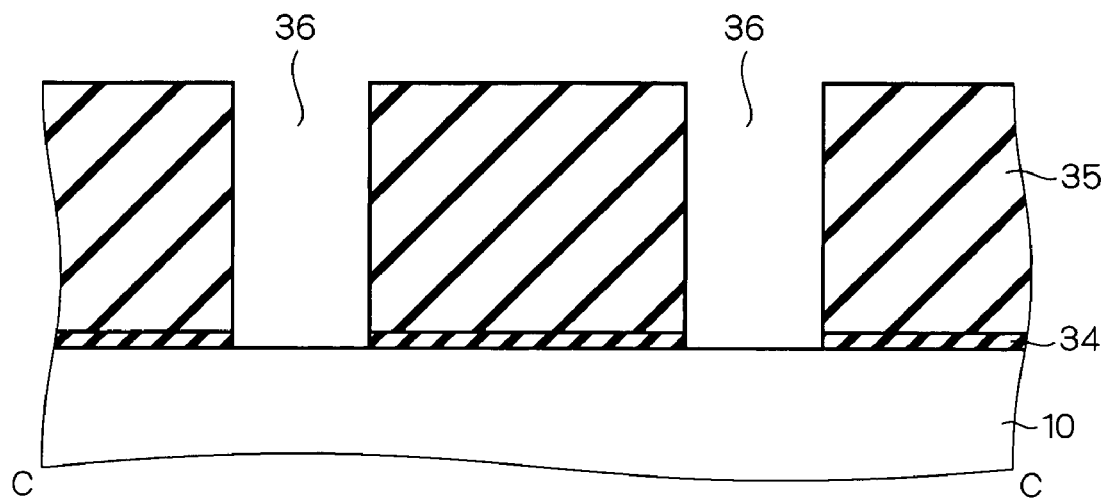
Figure 10:
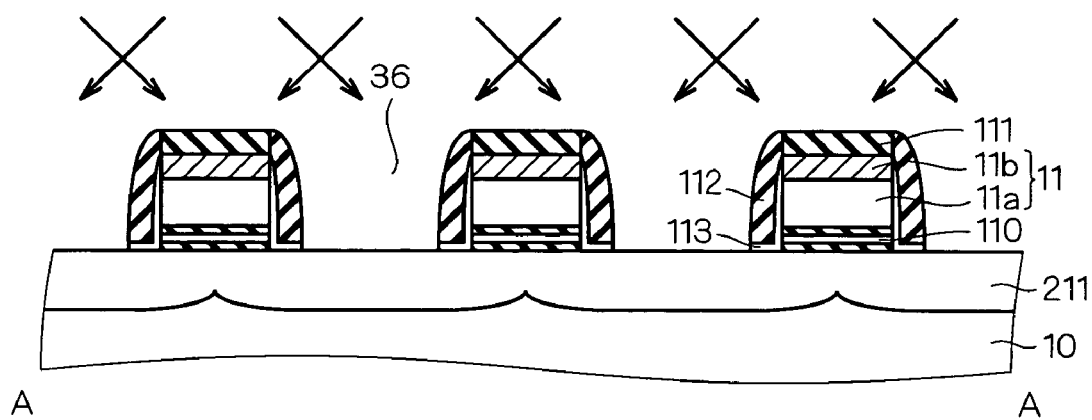
Figure 11:
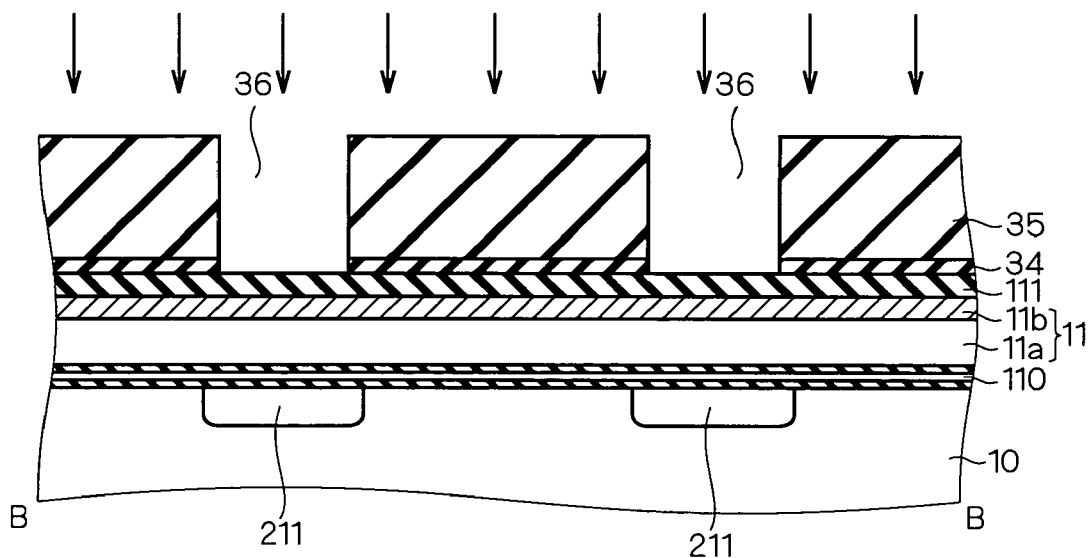
Figure 12:
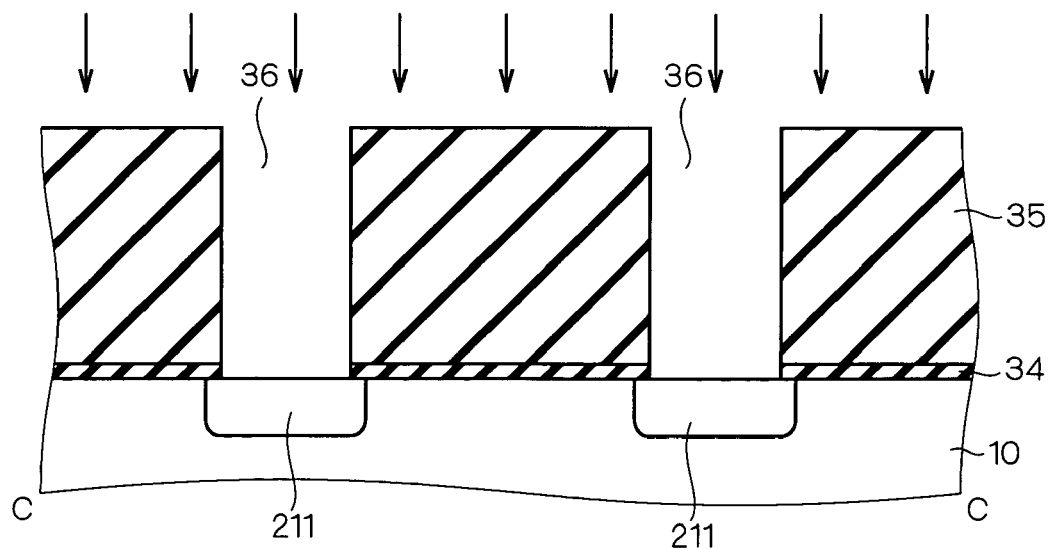
Figure 13:
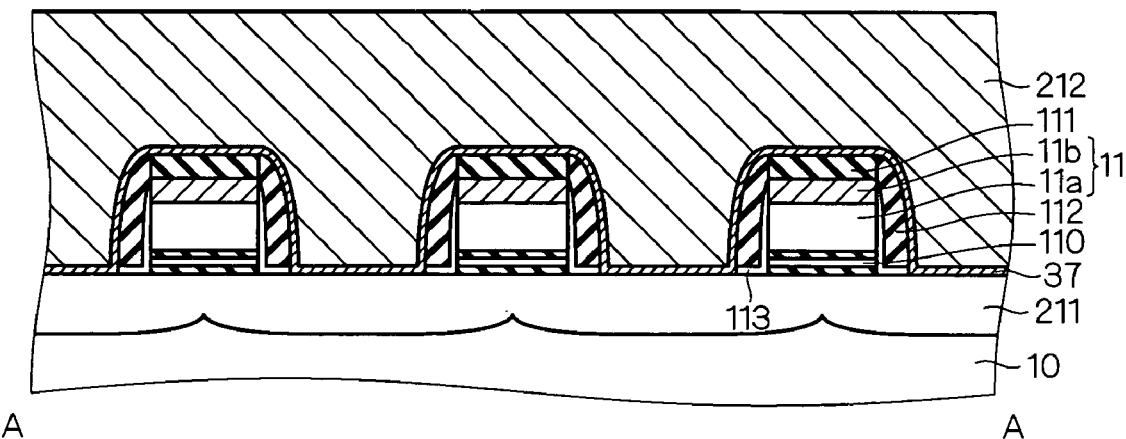
Figure 14:
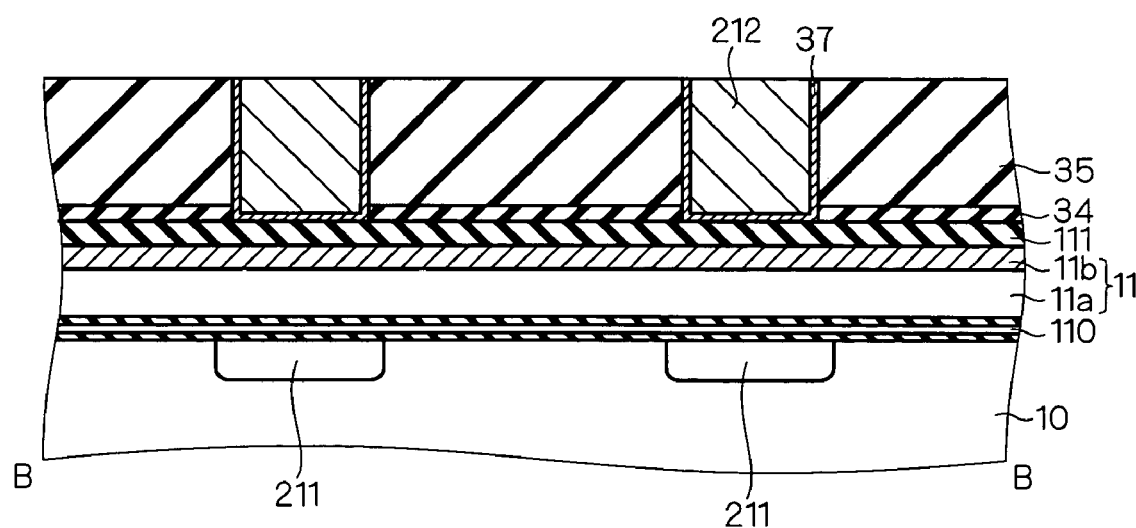
Figure 15:
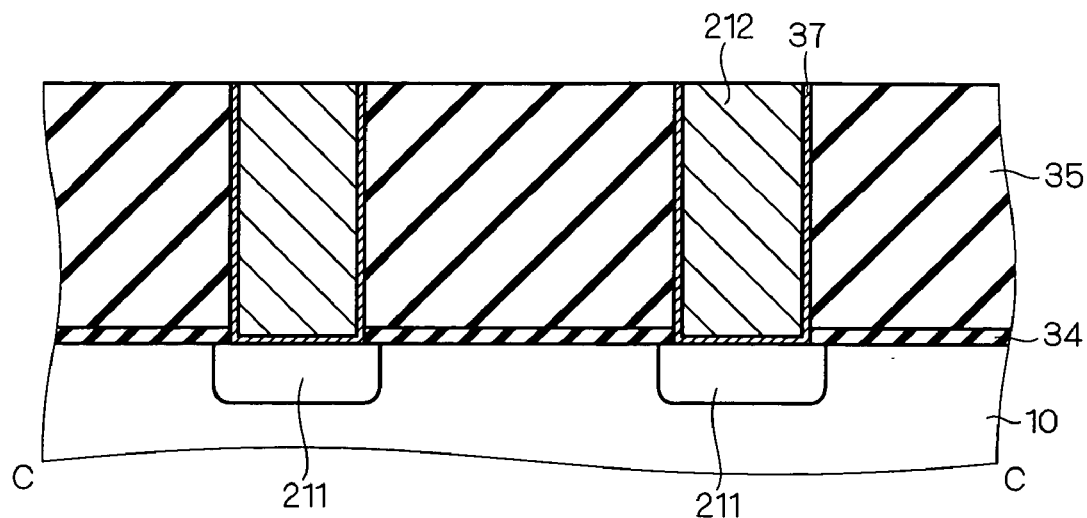

FIG. 3 to FIG. 12 are drawings illustrating manufacturing processes of the semiconductor memory device according to the present preferred embodiment. FIG. 3 to FIG. 7, FIG. 10 and FIG. 13 are cross-sectional views along a longitudinal direction of the bit line 21 in a forming region of the bit line 21 (cross-sectional views along an A—A line in FIG. 1). FIG. 8, FIG. 11 and FIG. 14 are cross-sectional views along a longitudinal direction of the word line 11 in a forming region of the word line 11 (cross-sectional views along a B—B line in FIG. 1). FIG. 9, FIG. 12 and FIG. 15 are cross-sectional views along the longitudinal direction of the word line 11 in a region between the word lines 11 (cross-sectional views along a C—C line in FIG. 1). A manufacturing method of the semiconductor memory device according to the present preferred embodiment is described on a basis of these drawings hereinafter.

Figure 3:
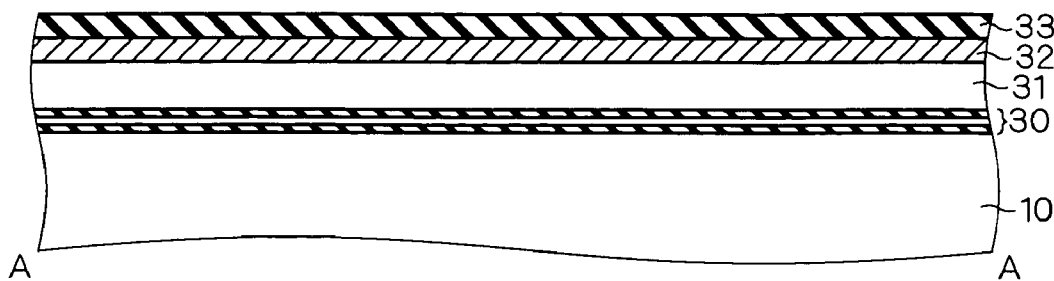
FIGS. 3 to 15 are drawings of manufacturing processes of the semiconductor memory device according to the preferred embodiment 1.

First, an ONO film 30 is formed by forming a silicon oxide film ($SiO_2$), a silicon nitride film (SiN) and a silicon oxide film ($SiO_2$) in order on a silicon substrate 10. Next, a polysilicon 31 is deposited, and on its upper part, a silicide 32 such as $WSi_2$ and so on, for example, is formed, and moreover on its upper part, a silicon nitride film 33 is deposited (FIG. 3).

Figure 4:
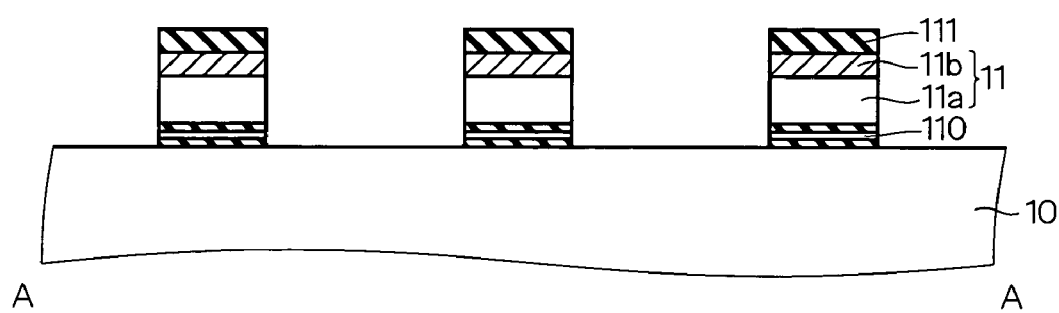

An etching is performed on the ONO film 30, the polysilicon 31, the silicide 32 and the silicon nitride film 33 by employing a photolithography technique, and the are patterned to be plural lines in parallel with each other. As a result, the word line 11 having the gate insulating film 110 of the ONO film (described as an "ONO film 110" hereinafter) on its lower surface and the hard mask 111 as the first insulating film of the silicon nitride film on its upper surface is formed (FIG. 4). The word line 11 has a double-layer structure composed of a polysilicon layer 11a and a silicide layer 11b. Although an illustration is omitted, it is desirable that the etching is made to stop in a degree to leave the silicon oxide film, the lowest layer of the ONO film 30, for a purpose to prevent an overetching to the silicon substrate 10 in case of patterning the word line 11.

Figure 5:
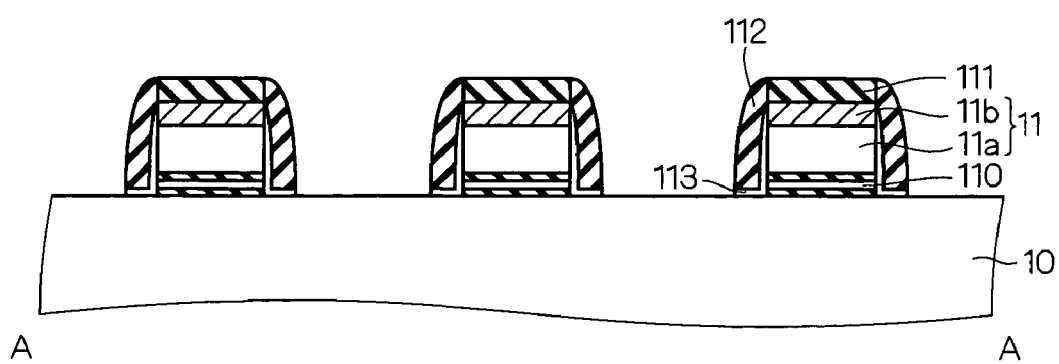

Next, after forming a thermal oxide film 113 on a side surface of the word line 11 and an upper surface of the silicon substrate 10, the sidewall 112 as a second insulating film is formed on the side surface of the word line 11 by depositing the silicon nitride film and performing an etch-back (FIG. 5). Moreover, an etching stopper layer 34 of the silicon nitride film and an interlayer insulating film 35 of the silicon oxide film are deposited (FIG. 6).

A trench 36 is formed in the interlayer insulating film 35 by removing a region where the bit line 21 in the interlayer insulating film 35 is supposed to be formed with performing an etching in a condition that the interlayer insulating film 35 and the etching stopper layer 34 have a large selective ratio in an etching. The bit line 21 is formed to run at right angles to the word line 11, thus the trench 36 running at right angles to the word line 11 is formed in the interlayer insulating film 35. The etching of the interlayer insulating film 35 is stopped by the etching stopper layer 34, thus the etching stopper layer 34 is exposed on the bottom of the trench 36. The semiconductor substrate 10 is exposed between the word lines 11 in the trench 36 by removing the etching stopper layer 34 exposed in the trench 36 (FIG. 7 to FIG. 9).

The diffusion bit line 211 is formed in the silicon substrate 10 by performing an ion implantation of phosphorus (P) or arsenic (As) with employing the interlayer insulating film 35 as a mask in the trench 36. The word line 11, the hard mask 111 and the sidewall 112 exists on the silicon substrate 10 in the trench 36, thus they function as the mask in case of the ion implantation. In the present preferred embodiment, that ion implantation is performed from an oblique direction inclined along a line of the trench 36 toward the silicon substrate 10. According to that, an impurity ion enters a region below the word line 11, and the diffusion bit line 211 is formed not only between the word lines 11 but also in the region below the word line 11 (FIG. 10 to FIG. 12). That is to say, the diffusion bit line 211 is formed to have a linear shape similar to that of the trench 36. Afterward, an anneal is performed to activate the impurity injected at the time of the ion implantation.

Moreover, the trench 36 is filled up by depositing a barrier metal 37 such as titanium nitride (TiN) and so on and a metal such as tungsten (W) and so on by a CVD (Chemical Vapor Deposition) method or a sputtering method on the interlayer insulating film 35. Then, an excessive barrier metal 37 and a metal film on an upper surface of the interlayer insulating film 35 are removed by an etch-back or a CMP (Chemical Mechanical Polishing) method. As a result, a metal bit line 212 having a linear shape identical with that of the trench 36 is formed (FIG. 13 to FIG. 15).

According to the processes described above, a formation of the memory cell array according to the present preferred embodiment illustrated in FIG. 1 and FIG. 2 is completed. After this, required wirings and so on are formed by processes similar to that of the manufacturing method of the conventional semiconductor memory device after forming moreover the other interlayer insulating film on the interlayer insulating film 35 and forming a contact to be connected with the metal bit line 212.

Generally, the semiconductor memory device includes a peripheral circuit in a region apart from the memory cell array on the semiconductor substrate, and a formation of the peripheral circuit is also performed in parallel with a forming process of the memory cell array. The semiconductor memory device according to the present preferred embodiment is also assumed to have the peripheral circuit which is not shown in the drawings on the silicon substrate 10. However, the conventional structure and the manufacturing method such as to be disclosed in the document "Can NROM, a 2-bit . . . " described above are applicable to the structure and the manufacturing method of that peripheral circuit, and the description is omitted in the present specification by reason that they have little relationship with the object of the present invention.

In the description described above, the word line 11 has the double-layer structure composed of the polysilicon layer 11a and the silicide layer 11b, however, a double-layer structure composed of a metal and polysilicon and a single-layer structure composed of only a metal are also applicable. Moreover, the hard mask 111, the sidewall 112 and the etching stopper layer 34 are all described as the silicon nitride film, however, other insulating films having an etching selectivity with the interlayer insulating film 35 (the silicon oxide film), a silicon oxide nitride film (SiON) and so on, for example, are also applicable. Moreover, also with regard to a material of the interlayer insulating film 35, an insulating film except for the silicon oxide film is also applicable when it has the large selective ratio in the etching toward the hard mask 111, the sidewall 112 and the etching stopper layer 34. Furthermore, the material of the metal bit line 212 is not limited to tungsten, and other materials such as cupper and so on are also applicable when it is a material applicable to a formation of a wiring by a Damasin process.

<Preferred Embodiment 2>

In the preferred embodiment 1, the diffusion bit line 211 is formed in the linear pattern in the lower side of the metal bit line 212. In contrast, in the preferred embodiment 2, the diffusion bit line 211 is formed in a discontinuous pattern (a dashed line in other words) disconnected under the word line 11 on the lower side of the metal bit line 212. Except for it, it has a composition similar to that the preferred embodiment 1 has.

Figure 16:
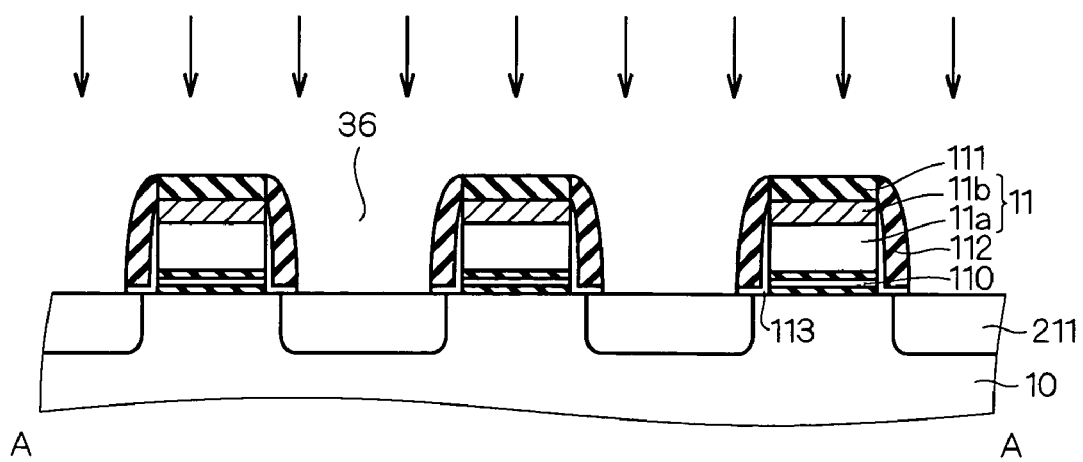
FIG. 16 is a drawing of a manufacturing process of a semiconductor memory device according to a preferred embodiment 2.

With regard to a manufacturing method of a semiconductor memory device according to the present preferred embodiment, an ion implantation to form the diffusion bit line 211 is performed from a direction perpendicular to a surface of the silicon substrate 10 in the forming process of the diffusion bit line 211 illustrated in FIG. 10 to FIG. 12 in the preferred embodiment 1 (FIG. 16). The injected ion does not reach a region right under the word line 11, and the diffusion bit line 211 is hardly formed in the region under the word line 11. That is to say, in the preferred embodiment 1, the diffusion bit line 211 is formed in the linear pattern similar to the trench 36, however, in the preferred embodiment 2, the diffusion bit line 211 is formed in the discontinuous pattern (the dashed line) disconnected under the word line 11. Except for that process, the manufacturing process in the preferred embodiment 2 is similar to that in the preferred embodiment 1, thus the description is omitted.

Figure 17:
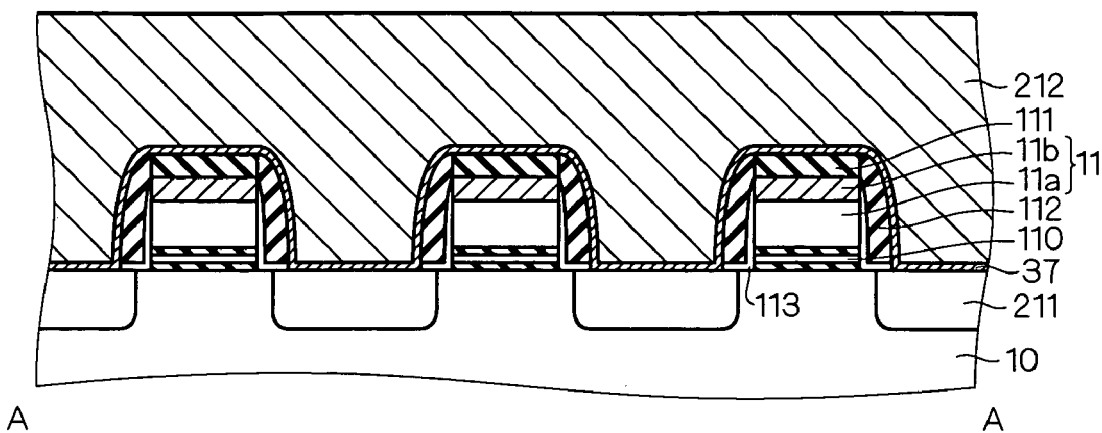
FIGS. 17 and 18 are drawings illustrating compositions of the semiconductor memory device according to the preferred embodiment 2.
Figure 18:
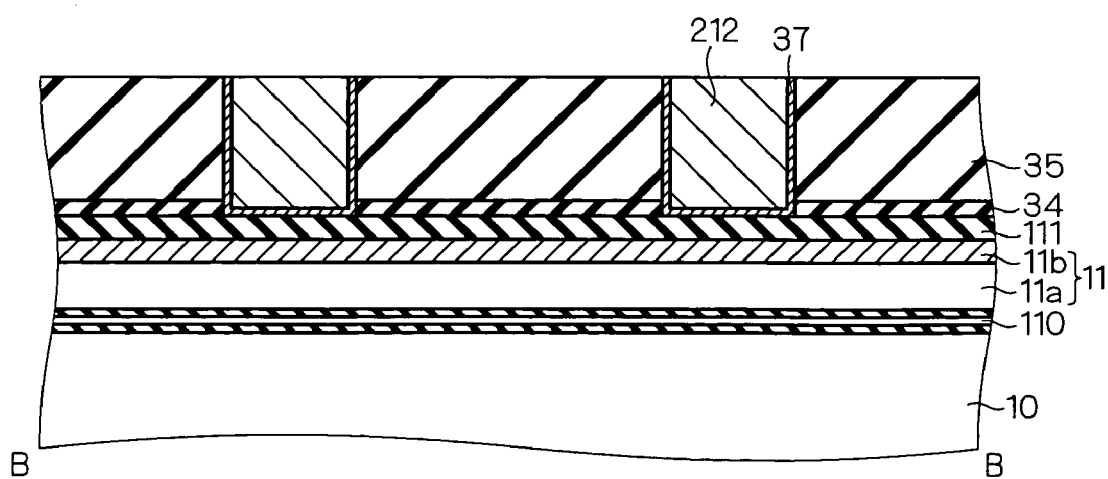

As a result, a composition of a memory cell according to the present preferred embodiment is such as illustrated in FIG. 17 and FIG. 18. FIG. 17 is a cross-sectional view along the longitudinal direction of the bit line 21 in the forming region of the bit line 21 (the cross-sectional view along the A—A line in FIG. 1). FIG. 18 is a cross-sectional view along the longitudinal direction of the word line 11 in the forming region of the word line 11 (the cross-sectional view along the B—B line). As shown in these drawings, the diffusion bit line 211 is not formed right under the word line 11. The diffusion bit line 211 has a dashed line shape disconnected under the word line 11 on the lower side of the metal bit line 212.

In the preferred embodiment 1, the diffusion bit line 211 in a region where the word line 11 and the bit line 21 cross becomes the source/drain of the memory transistor. In the present preferred embodiment, the diffusion bit line 211 is not formed in that region. However, when the memory transistor is activated, the word line 11 which is the gate electrode has a high potential, and an inversion layer is formed in that region, and then it functions as a source/drain.

According to the present preferred embodiment, an implantation energy in the ion implantation to form the diffusion bit line 211 can be smaller as compared with the preferred embodiment 1, thus an occurrence of a punch-through in the memory transistor can be controlled. Furthermore, the source/drain of the memory transistor is the inversion layer formed in an active state, thus a depth of a junction in the source/drain region becomes shallow. Accordingly, it is possible to contribute to a reduction of a size of the memory cell.

<Preferred Embodiment 3>

Figure 32:
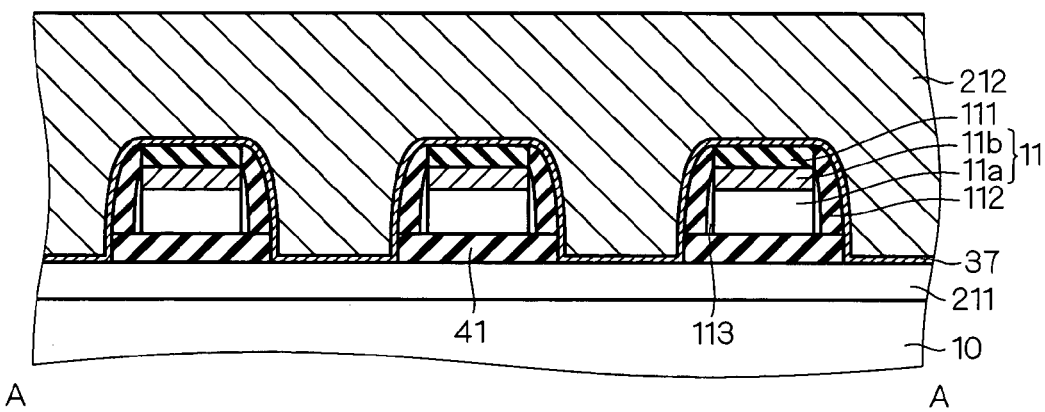
Figure 33:
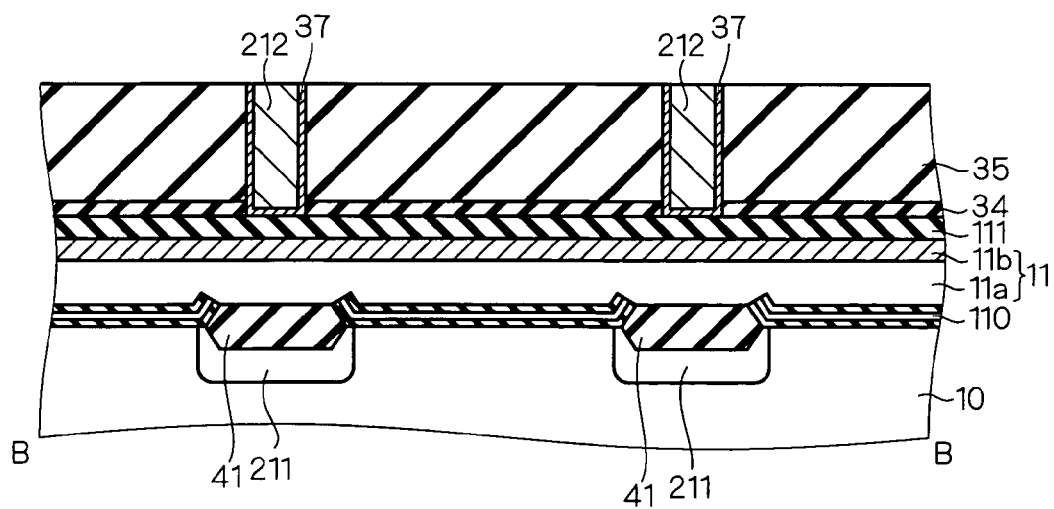
Figure 34:
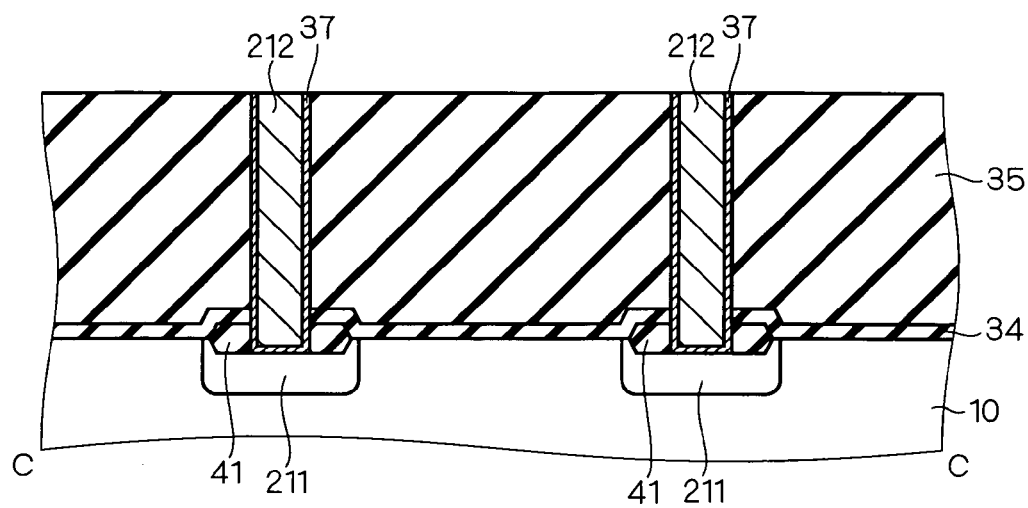

A memory cell array of a semiconductor memory device according to the preferred embodiment 3 has a third insulating film (an insulating film on diffusion bit line) formed in a linear pattern similar to the diffusion bit line 211 on an upper part of the linear diffusion bit line 211 in the memory cell array in the preferred embodiment 1. Except for it, it has a composition similar to that illustrated in FIG. 1 and FIG. 2. Also in the present preferred embodiment, the metal bit line 212 is connected with the diffusion bit line 211 between the word lines 11. According to that, the metal bit line 212 has a structure of going through the third insulating film between the word lines 11 (refer to FIG. 32 to FIG. 34 illustrated afterward).

Figure 31:
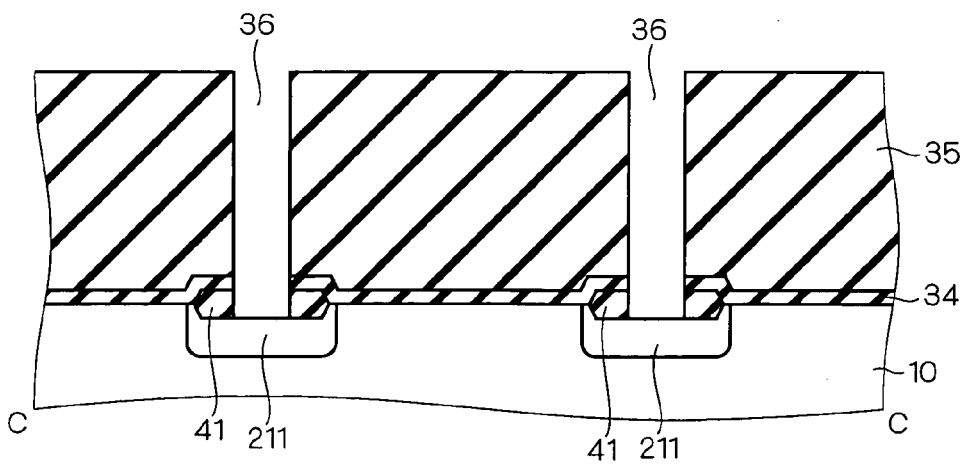

FIG. 19 to FIG. 34 are drawings illustrating manufacturing processes according to the present preferred embodiment. FIG. 20, FIG. 22, FIG. 24, FIG. 26, FIG. 28, FIG. 29 and FIG. 32 are cross-sectional views along the longitudinal direction of the bit line 21 in the forming region of the bit line 21 (cross-sectional views along the A—A line in FIG. 1). FIG. 19, FIG. 21, FIG. 23, FIG. 25, FIG. 27, FIG. 30 and FIG. 33 are cross-sectional views along the longitudinal direction of the word line 11 in the forming region of the word line 11 (cross-sectional views along the B—B line). FIG. 31 and FIG. 34 are cross-sectional views along the longitudinal direction of the word line 11 in the region between the word lines 11 (cross-sectional views along the C—C line). A manufacturing method of the semiconductor memory device according to the present preferred embodiment is described on a basis of these drawings hereinafter.

Figure 19:
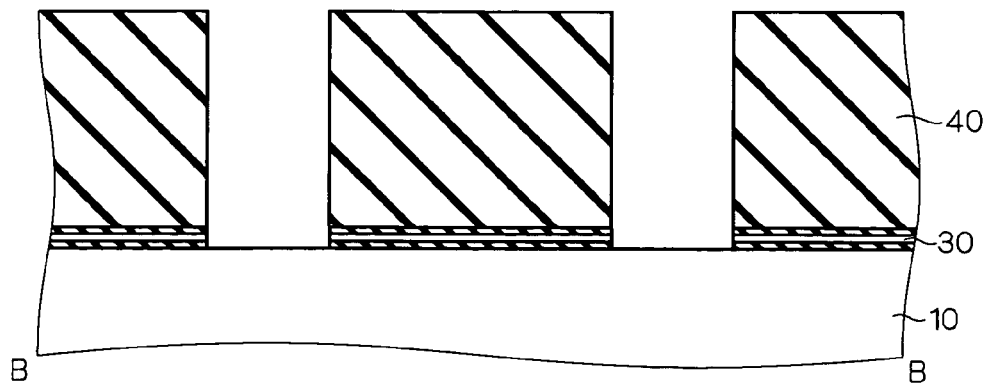
FIGS. 19 to 34 are drawings of manufacturing processes of a semiconductor memory device according to a preferred embodiment 3.
Figure 20:
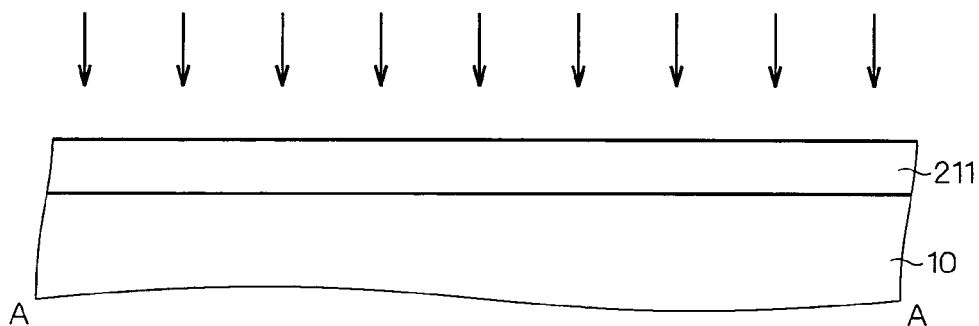
Figure 21:
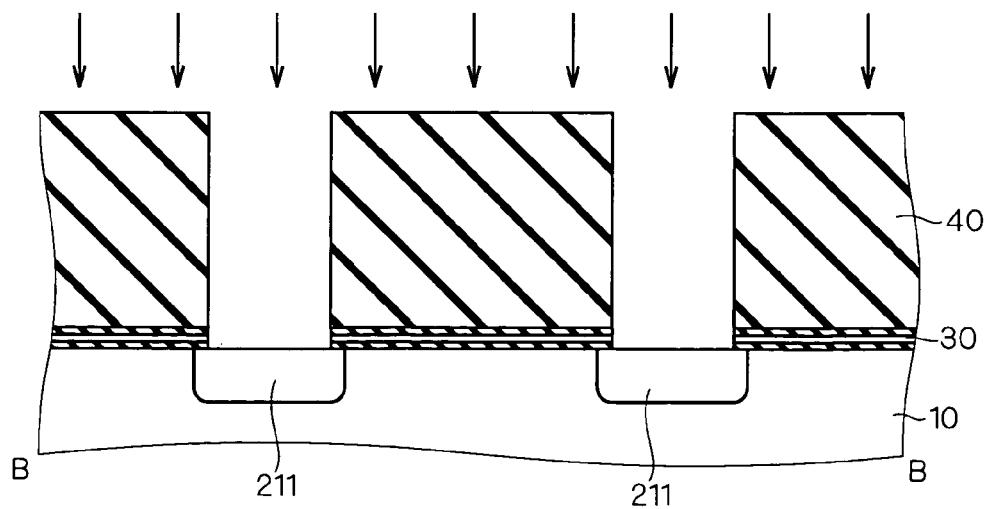

First, the ONO film 30 is formed on the silicon substrate 10, and the photo resist 40 is formed on it. An exposure development treatment is performed to the photo resist 40, and plural linear opening parts corresponding to a position of the forming region of the diffusion bit line 211 are formed. Moreover, the ONO film 30 is removed in a linear pattern by an etching employing that photo resist 40 as a mask. That is to say, the ONO film 30 on the forming region of the diffusion bit line 211 is removed (FIG. 19). Then, the linear diffusion bit line 211 is formed in the silicon substrate 10 by performing the ion implantation of phosphorus (P) or arsenic (As) with employing the photo resist 40 as a mask (FIG. 20 and FIG. 21).

Figure 22:
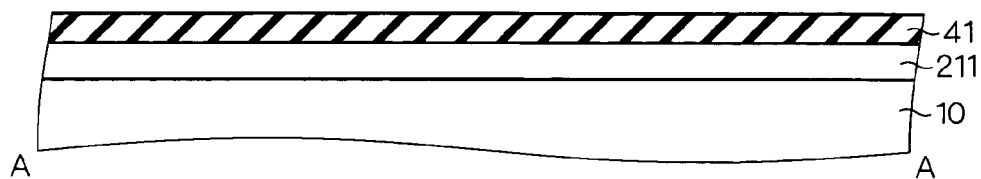
Figure 23:
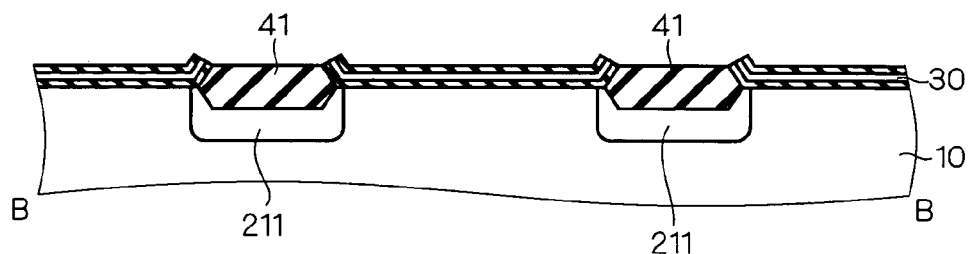
Figure 24:
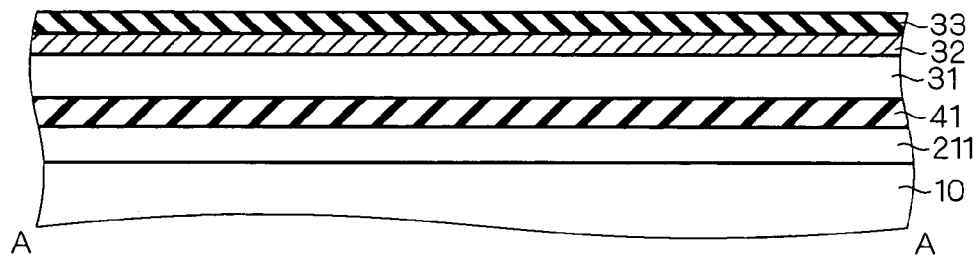
Figure 25:
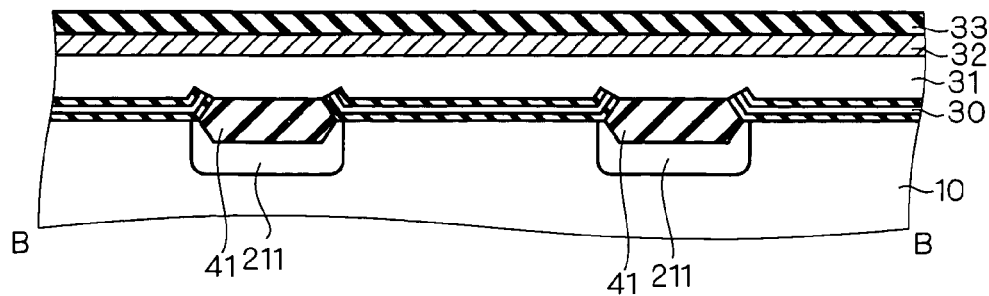

A linear LOCOS film 41 which is a third insulating film (an insulating film on diffusion bit line) is formed on an upper part of the diffusion bit line 211 by oxidizing a part which is not covered with the ONO film 30 of the silicon substrate 10 selectively (FIG. 22 and FIG. 23). The LOCOS film 41 is thinner than the film employed for an element isolation, for example. When a thermal treatment in a forming process of this LOCOS film 41 is performed, a diffusion of the impurity ion injected to form the diffusion bit line 211 is promoted. Next, the polysilicon 31 is deposited, and on its upper part, the silicide 32 such as $WSi_2$ and so on, for example, is formed, and moreover on its upper part, the silicon nitride film 33 is deposited (FIG. 24 and FIG. 25).

Figure 26:
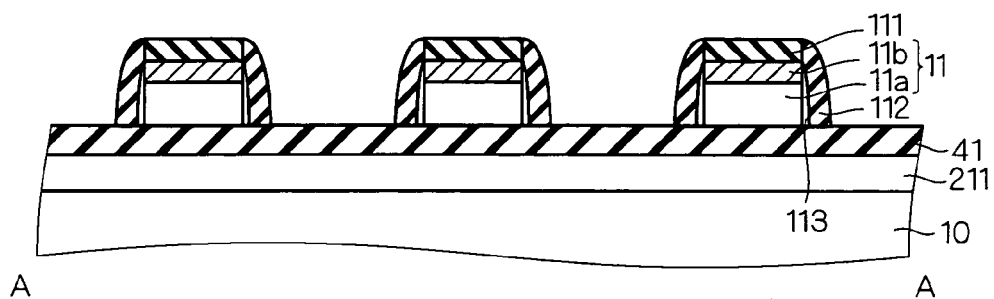
Figure 27:
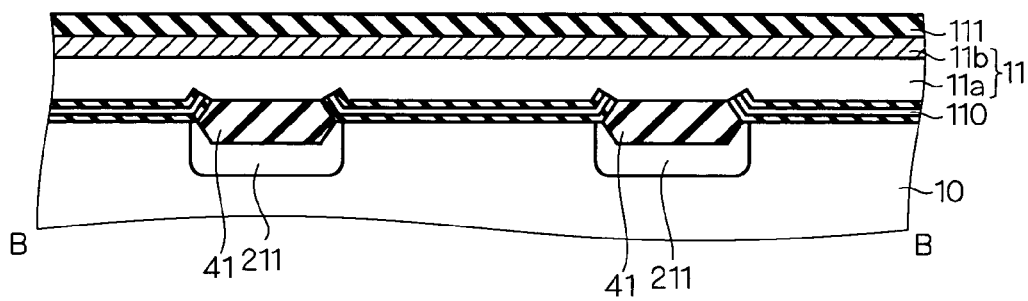
Figure 28:
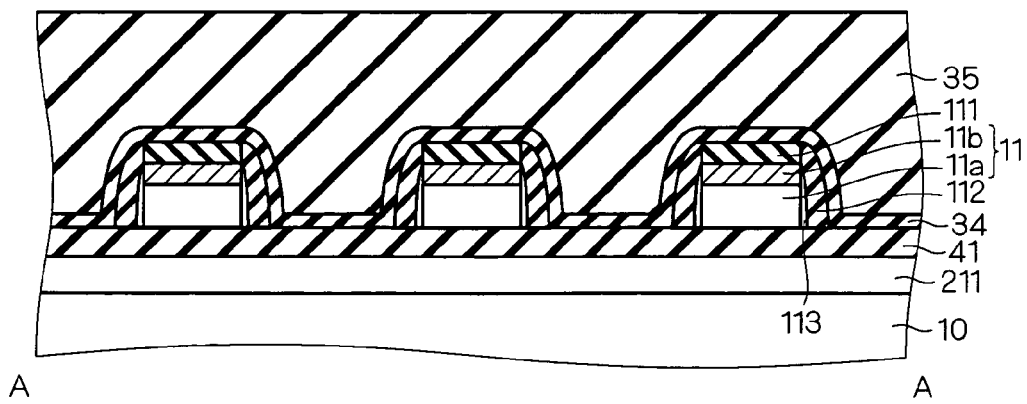

Moreover, the ONO film 30, the polysilicon 31, the silicide 32 and the silicon nitride film 33 are patterned to be the pattern of the plural linear word lines 11. As a result, the word line 11 composed of the polysilicon layer 11a and the silicide layer 11b and also having the hard mask 111 as the first insulating film of the silicon nitride film is formed on its upper surface on the gate insulating film 110 (described as an "ONO film 110" hereinafter) and the LOCOS film 41. The sidewall 112 as the second insulating film is formed on the side surface of the word line 11 after forming a thermal oxide film 113 (FIG. 26 and FIG. 27). Moreover, the etching stopper layer 34 of the silicon nitride film and the interlayer insulating film 35 of the silicon oxide film are deposited on it (FIG. 28).

Figure 29:
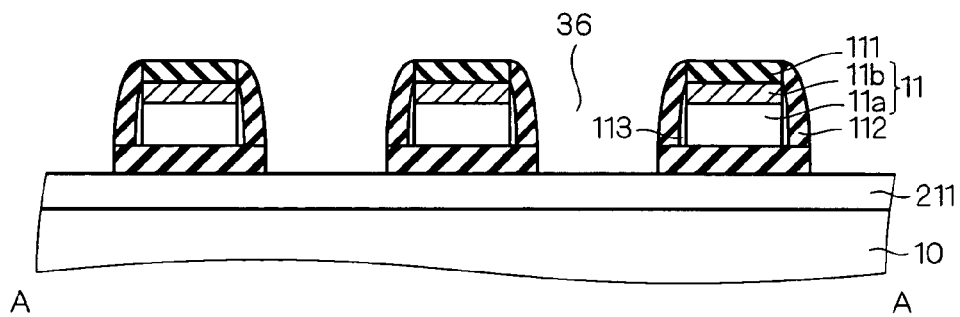
Figure 30:
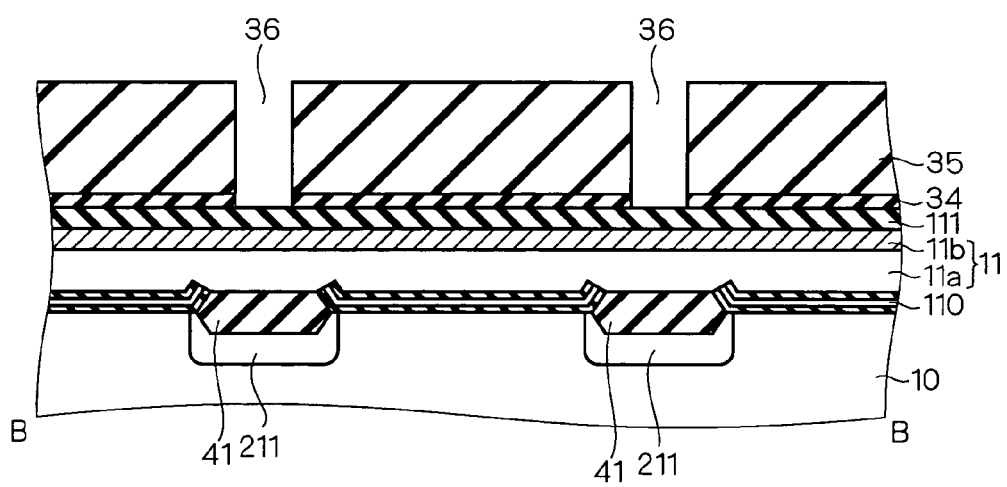

The trench 36 is formed in the region where the bit line 21 is supposed to be formed toward the interlayer insulating film 35. The bit line 21 and the word line 11 run at right angles to each other, thus the trench 36 is formed to run at right angles to the word line 11. Then, the etching stopper layer 34 and the LOCOS film 41 in the trench 36 are etched, and the semiconductor substrate 10 (the diffusion bit line 211) is exposed between the word lines 21 in the trench 36 (FIG. 29 and FIG. 31).

Moreover, the trench 36 is filled up by depositing the barrier metal 37 such as TiN and so on and the metal such as tungsten (W) and so on by the CVD method or the sputtering method on the interlayer insulating film 35. Then, the excessive barrier metal 37 and the metal film on the upper surface of the interlayer insulating film 35 are removed by the etch-back or the CMP method. As a result, the metal bit line 212 having the linear shape identical with that of the trench 36 is formed (FIG. 32 to FIG. 34). As shown in FIG. 34, the metal bit line 212 is connected with the diffusion bit line 211 between the word lines 11 with going through the insulating film on diffusion bit line.

According to the processes described above, the formation of the memory cell array according to the present preferred embodiment is completed. After this, required wirings and so on are formed by the processes similar to that of the manufacturing method of the conventional semiconductor memory device after forming moreover the other interlayer insulating film on the interlayer insulating film 35 and forming the contact to be connected with the metal bit line 212.

According to the present preferred embodiment, an ion implantation to form the diffusion bit line 211 is performed before forming the word line 11, thus the word line 11 does not become a mask when that ion implantation is performed. Accordingly, the diffusion bit line 211 whose concentration of an impurity is uniform is formed in a longitudinal direction of the diffusion bit line 211. Moreover, an impurity ion of the diffusion bit line 211 is thermally diffused by a heat treatment in a forming process of the LOCOS film 41 performed after forming the diffusion bit line 211, thus a profile of the concentration of the impurity in the diffusion bit line 211 does not become rapid as compared with that in the preferred embodiment 1. Accordingly, the memory cell (the memory transistor) can perform stably and reliability in the performance is improved.

<Preferred Embodiment 4>

Figure 42:
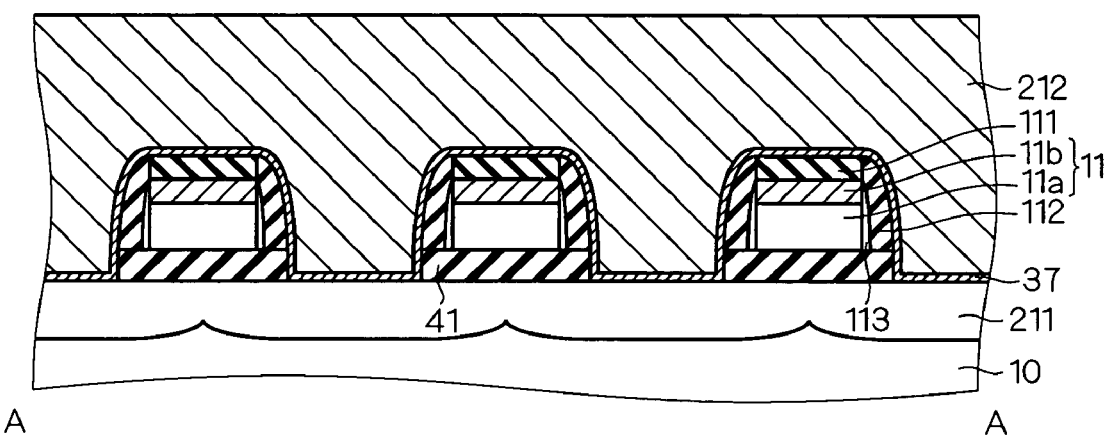
Figure 43:
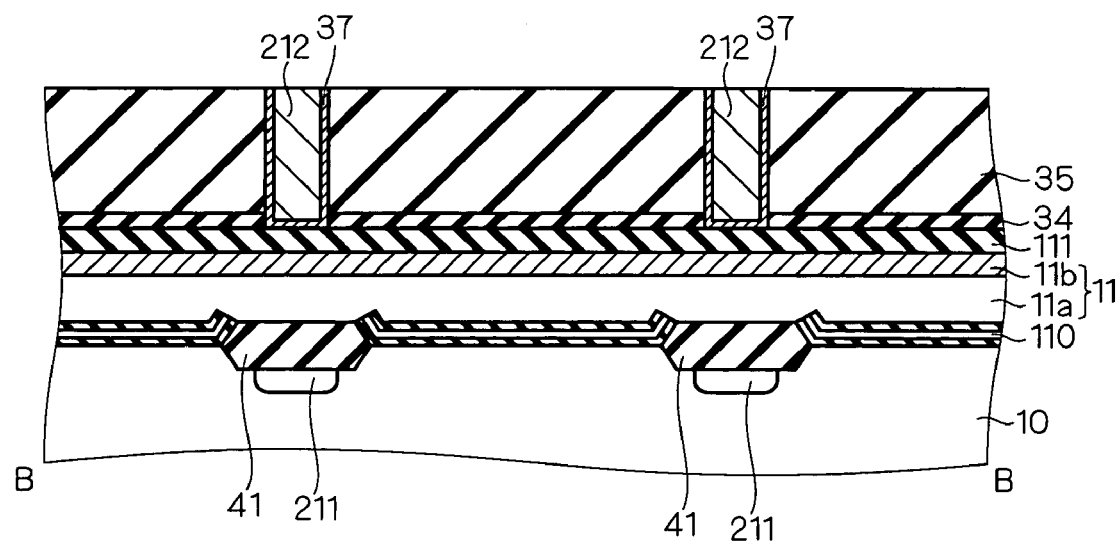
Figure 44:
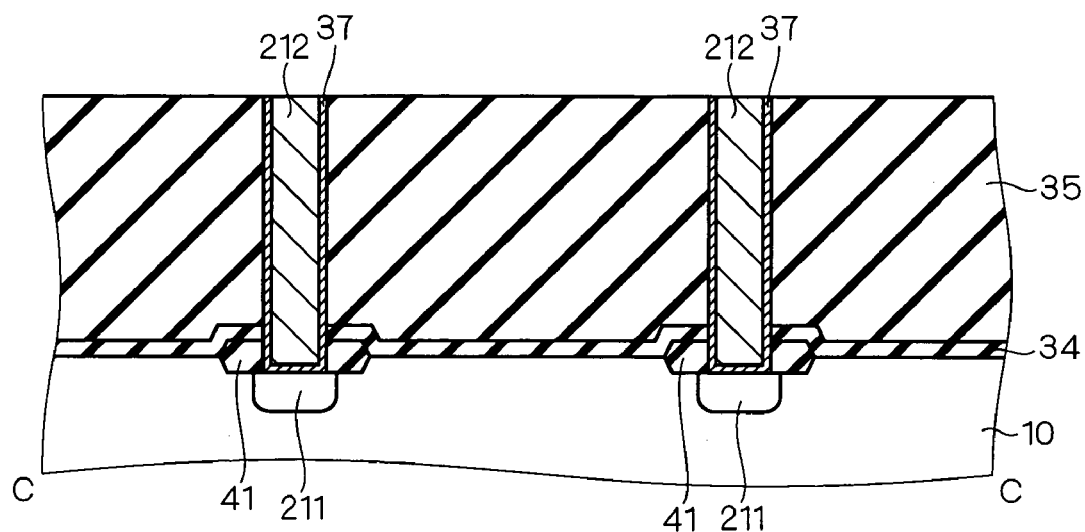

A memory cell array of a semiconductor memory device according to the preferred embodiment 4 has a structure that a width of the diffusion bit line 211 is narrower than a width of the LOCOS film 41 which is the third insulating film (the insulating film on diffusion bit line) in the memory cell array in the preferred embodiment 3 (refer to FIG. 42 to FIG. 44 illustrated afterward).

Figure 35:
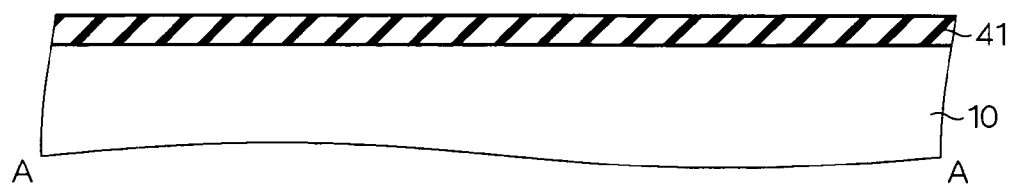
FIGS. 35 to 44 are drawings of manufacturing processes of a semiconductor memory device according to a preferred embodiment 4.
Figure 36:
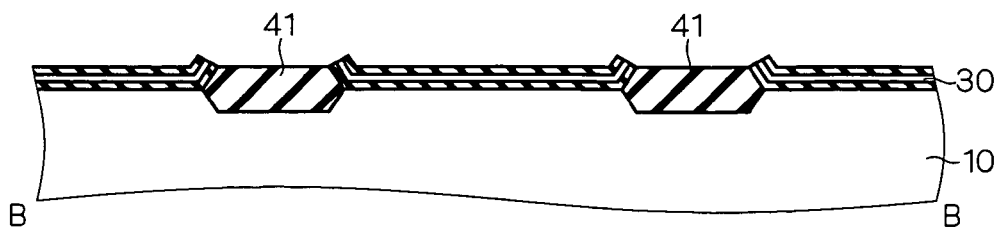
Figure 38:
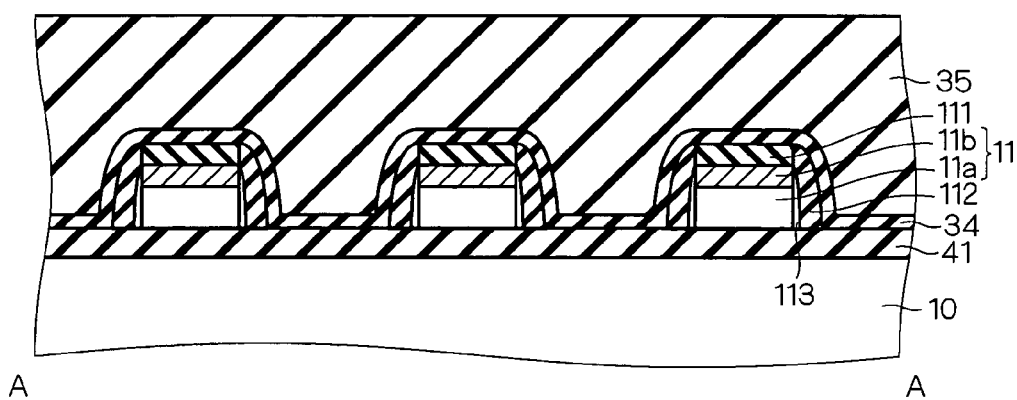
Figure 39:
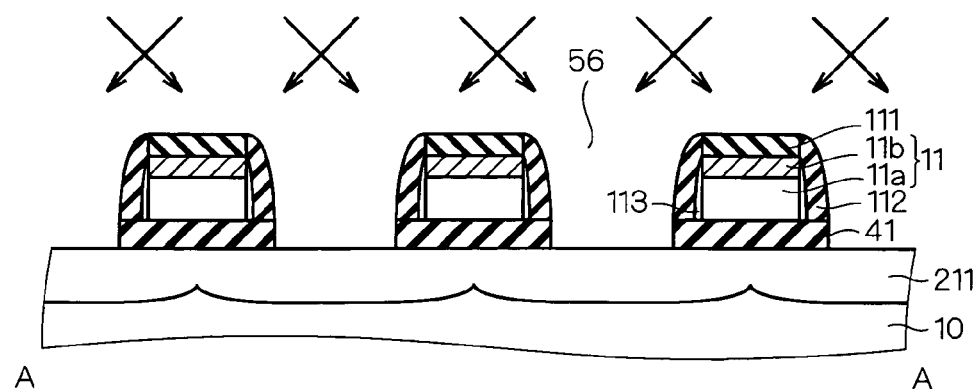
Figure 40:
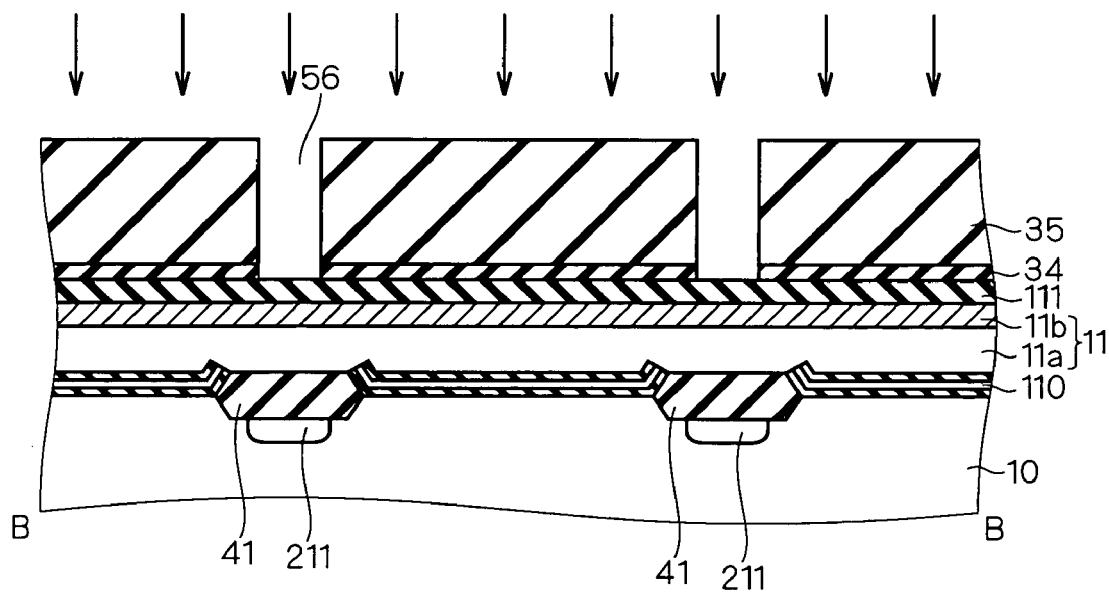
Figure 41:
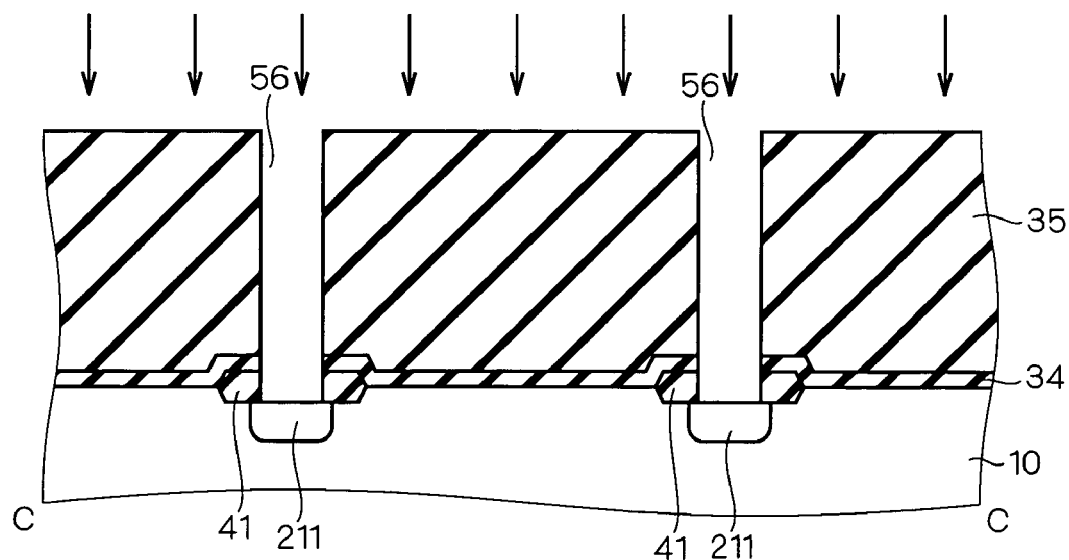

FIG. 35 to FIG. 44 are drawings illustrating manufacturing processes of the semiconductor memory device according to the present preferred embodiment. FIG. 35, FIG. 37 to FIG. 39 and FIG. 42 are cross-sectional views along the longitudinal direction of the bit line 21 in the forming region of the bit line 21 (cross-sectional views along the A—A line in FIG. 1). FIG. 36, FIG. 40 and FIG. 43 are cross-sectional views along the longitudinal direction of the word line 11 in the forming region of the word line 11 (cross-sectional views along the B—B line). FIG. 41 and FIG. 44 are cross-sectional views along the longitudinal direction of the word line 11 in the region between the word lines 11 (cross-sectional views along the C—C line). A manufacturing method of the semiconductor memory device according to the present preferred embodiment is described on a basis of these drawings hereinafter.

First, the ONO film 30 is formed on the silicon substrate 10 in the same manner as the preferred embodiment 3, and the ONO film 30 on the forming region of the diffusion bit line 211 is removed. Then, the linear LOCOS film 41 which is the third insulating film (the insulating film on diffusion bit line) is formed by oxidizing the part which is not covered with the ONO film 30 of the silicon substrate 10 selectively without performing the ion implantation (FIG. 35 and FIG. 36).

Figure 37:
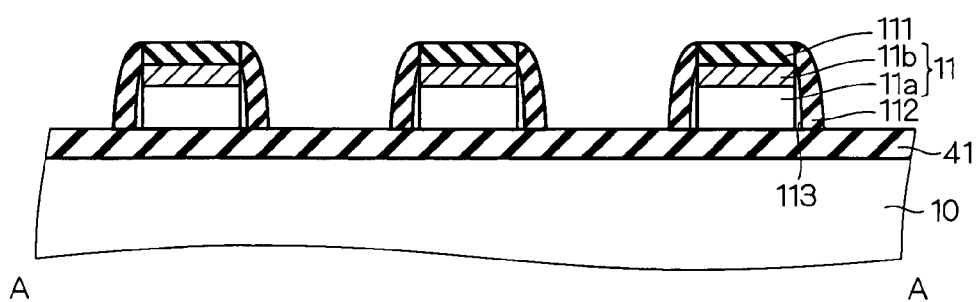

Next, the word line 11 having the hard mask 111 as the first insulating film of the silicon nitride film is formed on its upper surface and the sidewall 112 as the second insulating film on its side surface is formed on the gate insulating film 110 (described as the "ONO film 110" hereinafter) and the LOCOS film 41 (FIG. 37). Moreover, the etching stopper layer 34 of the silicon nitride film and the interlayer insulating film 35 of the silicon oxide film are deposited on it (FIG. 38).

A trench 56 is formed in the region where the bit line 21 is supposed to be formed toward the interlayer insulating film 35. In this time, a width of the trench 56 is formed to be narrower than the width of the LOCOS film 41. The etching stopper layer 34 and the LOCOS film 41 in the trench 56 are etched, and the semiconductor substrate 10 (the diffusion bit line 211) is exposed between the word lines 21 in the trench 56.

The diffusion bit line 211 is formed in the silicon substrate 10 by performing the ion implantation of phosphorus (P) or arsenic (As) with employing the interlayer insulating film 35 in which the trench 56 is formed as the mask in the trench 56. In the same manner as the preferred embodiment 1, this ion implantation is performed from the oblique direction inclined along a line of the trench 56 toward the silicon substrate 10. According to that, the impurity ion enters the region under the word line 11, and the diffusion bit line 211 is formed not only between the word lines 11 but also in the region under the word line 11 (FIG. 39 to FIG. 41). That is to say, the diffusion bit line 211 is formed to have the linear shape similar to that of the trench 56 in the interlayer insulating film 35. The width of the trench 56 is narrower than the width of the LOCOS film 41, thus as shown in FIG. 40 and FIG. 41, a width of the diffusion bit line 21 is formed to be narrower than the width of the LOCOS film 41.

Moreover, the trench 36 is filled up by depositing the barrier metal 37 such as TiN and so on and the metal such as tungsten (W) and so on by the CVD method or the sputtering method on the interlayer insulating film 35. Then, the excessive barrier metal 37 and the metal film on the upper surface of the interlayer insulating film 35 are removed by the etch-back or the CMP method. As a result, the metal bit line 212 having the linear shape identical with that of the trench 56 is formed (FIG. 42 to FIG. 44). As shown in FIG. 44, the metal bit line 212 is connected with the diffusion bit line 211 between the word lines 11 with going through the insulating film on diffusion bit line.

According to the processes described above, the formation of the memory cell array according to the present preferred embodiment is completed. After this, the required wirings and so on are formed by the processes similar to that of the manufacturing method of the conventional semiconductor memory device after forming moreover the other interlayer insulating film on the interlayer insulating film 35 and forming the contact to be connected with the metal bit line 212.

According to the present preferred embodiment, as shown from a comparison of FIG. 33 and FIG. 43, the width of the diffusion bit line 211 is narrower than that of the LOCOS film 41, and an edge part of the diffusion bit line 211 is not stuck out from a horizontal direction of the LOCOS film 41. Accordingly, an electric field concentration in an edge part of a source/drain of the memory transistor is weakened. According to that, the memory cell (the memory transistor) can perform stably and reliability in the performance is improved. Moreover, an alignment of the diffusion bit line 211 with the metal bit line 212 is not necessary, thus a margin that a slippage of the alignment is considered is not necessary, and it is possible to contribute to a high integration of the memory cell.

<Preferred Embodiment 5>

In the preferred embodiment 4, the diffusion bit line 211 is formed in the linear shape on the lower side of the metal bit line 212. In the preferred embodiment 5, in contrast, the diffusion bit line 211 is formed in a discontinuous pattern (a dashed line in other words) disconnected on the lower side of the metal bit line 212.

Figure 45:
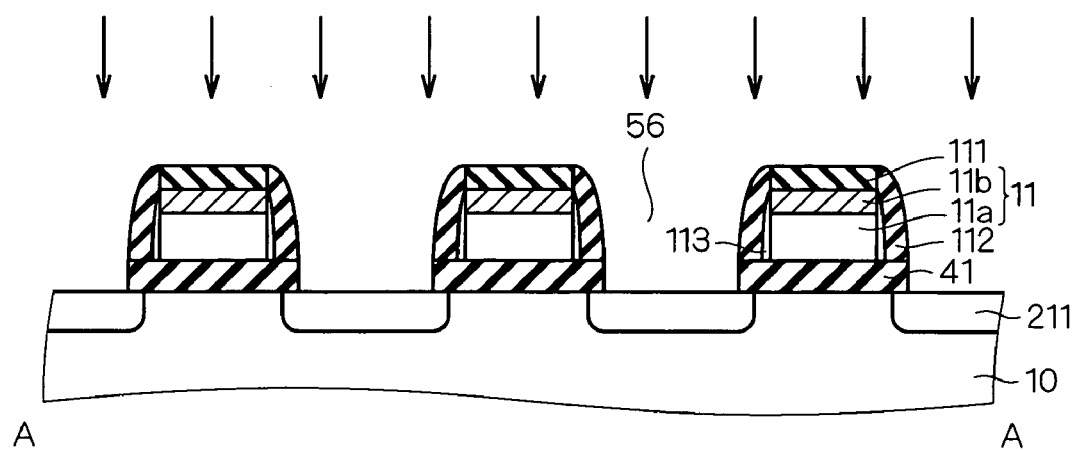
FIGS. 45 to 47 are drawings of manufacturing processes of a semiconductor memory device according to a preferred embodiment 5.

With regard to a manufacturing method of a semiconductor memory device according to the present preferred embodiment, the ion implantation to form the diffusion bit line 211 is performed from the direction perpendicular to the surface of the silicon substrate 10 in the forming process of the diffusion bit line 211 illustrated in FIG. 39 to FIG. 41 in the preferred embodiment 4 (FIG. 45). The injected ion does not reach a region right under the word line 11, and the diffusion bit line 211 is hardly formed in the region under the word line 11. That is to say, in the preferred embodiment 4, the diffusion bit line 211 is formed in the linear pattern similar to the trench 36, however, in the preferred embodiment 5, the diffusion bit line 211 is formed in the discontinuous pattern (the dashed line) disconnected under the word line 11. Except for that process, the manufacturing process in the preferred embodiment 5 is similar to that in the preferred embodiment 4, thus the description is omitted.

Figure 46:
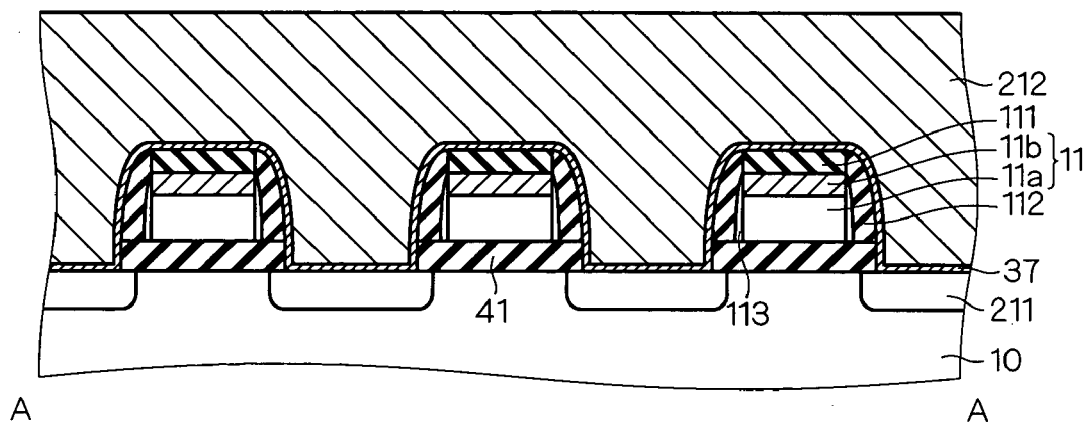
Figure 47:
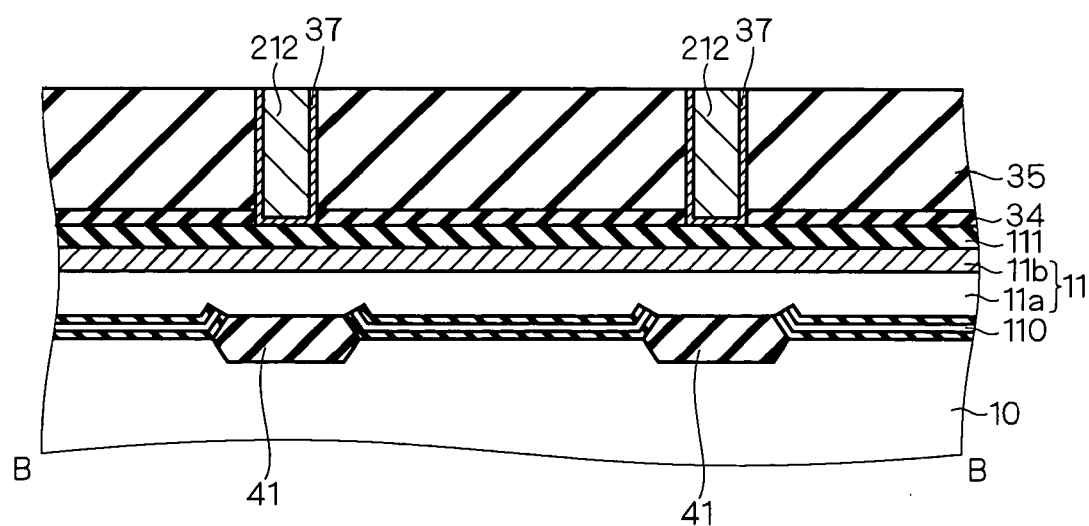

As a result, a composition of a memory cell according to the present preferred embodiment is such as illustrated in FIG. 46 and FIG. 47. FIG. 46 is a cross-sectional view along the longitudinal direction of the bit line 21 in the forming region of the bit line 21 (a cross-sectional view along the A—A line in FIG. 1). FIG. 47 is a cross-sectional view along the longitudinal direction of the word line 11 in the forming region of the word line 11 (a cross-sectional view along the B—B line). As shown in these drawings, the diffusion bit line 211 is not formed right under the word line 11. The diffusion bit line 211 has a dashed line shape disconnected under the word line 11 on the lower side of the metal bit line 212.

In the same manner as the preferred embodiment 2, the diffusion bit line 211 is not formed in a region which is supposed to become the source/drain of the memory transistor, however, when the memory transistor is activated, the word line 11 which is the gate electrode has the high potential, and the inversion layer is formed in that region, and then it functions as the source/drain. According to that, it is necessary to form the LOCOS film 41 in the present preferred embodiment thin enough to form the inversion layer under the LOCOS film 41 by the high potential of the word line 11.

According to the present preferred embodiment, the implantation energy in the ion implantation to form the diffusion bit line 211 can be smaller as compared with the preferred embodiment 4, thus the occurrence of the punch-through in the memory transistor can be controlled. Furthermore, the source/drain of the memory transistor is the inversion layer formed in the active state, thus the depth of the junction in the source/drain region becomes shallow. Accordingly, it is possible to contribute to the reduction of the size of the memory cell.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory device, comprising:
    plural linear word lines formed on a semiconductor substrate;
    plural linear bit lines running at right angles to said word lines;
    a memory transistor formed between said bit lines in said semiconductor substrate and employing said word lines as a gate electrode; and
    an interlayer insulating film formed on said memory transistor, wherein
    each of said bit lines is composed of
    a diffusion bit line formed in said semiconductor substrate and
    a metal bit line formed with being buried in said interlayer insulating film in a linear pattern and connected with said diffusion bit line between said word lines, wherein said metal bit line overlies said word lines and said diffusion bit line is formed in a continuous linear pattern under said metal bit line on a lower side of said word lines.

2. The semiconductor memory device according to claim 1, wherein
    a gate insulating film under said gate electrode is an ONO (Oxide Nitride Oxide) film in said memory transistor.

3. The semiconductor memory device according to claim 1, further comprising:
    an insulating film on diffusion bit line formed in a linear pattern on an upper part of said diffusion bit line, wherein
    said metal bit line goes through said insulating film on diffusion bit line and is connected with said diffusion bit line between said word lines.

4. The semiconductor memory device according to claim 3, wherein
    a width of said diffusion bit line is narrower than a width of said insulating film on diffusion bit line.

5. The semiconductor memory device according to claim 1, wherein
    a memory cell array formed with a plurality of said memory transistors has a fieldless array structure.

* * * * *